(12) United States Patent
Fuki et al.

(10) Patent No.: US 6,856,846 B2
(45) Date of Patent: Feb. 15, 2005

(54) 3-D MODELING METHOD

(75) Inventors: Naoki Fuki, Okazaki (JP); Koichi Suzumura, Obu (JP)

(73) Assignee: Denso Corporation, Kariya (JP)

( * ) Notice: Subject to any disclaimer, the term of this patent is extended or adjusted under 35 U.S.C. 154(b) by 203 days.

(21) Appl. No.: 10/246,518

(22) Filed: Sep. 19, 2002

(65) Prior Publication Data

US 2003/0055521 A1 Mar. 20, 2003

(30) Foreign Application Priority Data

Sep. 20, 2001 (JP) .................................... 2001-287581

(51) Int. Cl.⁷ .............................................. G06F 19/00
(52) U.S. Cl. ...................... 700/98; 700/182; 345/419; 382/154
(58) Field of Search ........................... 700/97, 98, 163, 700/182; 345/418, 419; 359/458; 382/154

(56) References Cited

U.S. PATENT DOCUMENTS 4,933,865 A * 6/1990 Yamamoto et al. ......... 700/182

2001/0055013 A1   12/2001  Fuki
2002/0008700 A1    1/2002  Fuki

* cited by examiner

*Primary Examiner*—Leo Picard
*Assistant Examiner*—Charles Kasenge
(74) *Attorney, Agent, or Firm*—Nixon & Vanderhye P.C.

(57) ABSTRACT

A 3-D modeling system is provided for reducing design costs an efficient drawing checking operation. A number of CAD units and a server are connected through network and can communicate. The CAD unit includes an input device including a keyboard, a mouse device and the like, a computer, forming the center of the system, and a display device. The server stores a working process database including working process information. When checking a drawing for a 3-D model, the computer recognizes the shape of the 3-D model, divides the model into elements based on the shape recognition and determines an optimum working requirement for each element from the working process information. After the determination of the working requirement, if a correction is necessary, a message indicating the need for correction is displayed.

5 Claims, 7 Drawing Sheets

3-D MODELING METHOD

CROSS REFERENCES TO RELATED APPLICATIONS

This application relates to and incorporates by reference Japanese patent application No. 2001-287581, which was filed on Sep. 20, 2001.

BACKGROUND OF THE INVENTION

The present invention relates to a computer-aided three-dimensional modeling system, and more particularly, to improvements for checking drawings for three-dimensional models.

In recent years, design drawings have changed from two-dimensional drawings to direct three-dimensional (hereinafter referred as "3-D") modeling or 3-D models. According to the conventional two-dimensional system, if a product is made into a shape not intended, the drawing is eventually referred to for a correct shape, and the shape can be read based on the size or drawing rules. Therefore, the product can eventually be produced as designed. In the 3-D system, however, a designed model is directly used in the succeeding process (working process), and an incorrect shape is reflected in the product. Therefore, checking drawings in the design step is crucial. If the succeeding process is not fully taken into account in the step of designing a 3-D model, an unexpected correction might be necessary, which could increase the manufacturing cost.

More specifically, when a designed model for a resin molded product or other molded products is produced, the manufacturing cost for the mold could be increased if modeling is carried out without taking into account elements in the succeeding process such as how to produce the mold or the structure of the mold. Fillet surfaces (rounded corners) or ribs drawn thoughtlessly to be too small or thin for example might not allow machining when a mold is manufactured, and electric discharge machining or even manual handling might be required.

According to conventional two-dimensional designing, a mold designer, for example, reads the shape based on the drawing in the succeeding process, and makes a judgment (for example, about which manufacturing method to employ). At the time, the designer is notified of any special working required, and therefore there is little problem in that connection. According to the 3-D system, however, a model produced by a designer is used "as is" for a mold model, and therefore the details of the shape must be checked. Practically speaking, however, it would be impossible for the designer to consider entirely how to design the mold when producing a design model.

It takes a lot of time to check whether or not each part of a 3-D model is produced as intended by the design. There is a high likelihood that a mistake will occur. It is particularly difficult to find errors related with fillet surfaces or chamfers that tend to be easily omitted in drawings.

SUMMARY OF THE INVENTION

The present invention is directed to a solution to the above disadvantages, and it is an object of the present invention to provide a 3-D modeling system that allows the drawing checking operation to be more efficient and 3-D models to be designed less costly.

A 3-D modeling system according to a first aspect of the present invention includes a computer unit, a display unit, and a storage unit. The storage unit stores a working process database including various pieces of working process information. At the time of drawing checking for a 3-D model, in particular, the computer unit recognizes the shape of the 3-D model and divides the model into a plurality of elements based on the result of shape recognition and an optimum working requirement for each of the elements divided from the model is determined from the working process information using the working process database. After the determination of the working requirement, when a correction is necessary to the model based on the result of determining whether or not the 3-D model is appropriate, a message indicating the necessity of correction is displayed at the display unit.

Briefly stated, if there is discrepancy between the 3-D model and the working requirement, a correction to the 3-D model is recommended. In response to the message indicating the necessity of correction, the 3-D model is corrected (re-considered) as required. In this case, while the working process information is added to the 3-D model, the drawing can appropriately be checked. Therefore, if the drawing checker (engineer or other worker) checking the 3-D model is not well acquainted with the working process (succeeding process) for the product, the 3-D model well adapted for the working process can be provided. Therefore, the drawing checking operation can be efficient, and the 3-D model can be designed less costly. In addition, different drawing checkers could be in charge and resulting models will not vary.

Herein, the term "drawing checking" refers not only to checking a 3-D model for the shape and size, but also checking practicability or optimality in view of the working process for the product. The term "working process" generally refers to the succeeding process carried out using the 3-D model and includes the steps of manufacturing a mold used to form the product as well as cutting, finishing and treating the surface of the product.

According to a second aspect of the invention, the storage unit stores a cost database including cost information. The computer unit calculates a cost corresponding to the determined working requirement using the cost database and has the cost displayed at the display unit. In this way, a 3-D model in consideration of the cost can be produced.

According to a third aspect of the invention, a target cost requirement for manufacturing a product is preset, and when a designed 3-D model does not satisfy the target cost requirement, a message indicating the necessity of correction to the model is displayed at the display unit. In this way, when the target cost requirement is not satisfied, a change to the design is recommended, so that the 3-D model is corrected as required. As a result, a 3-D model satisfying the target cost requirement can be produced.

For a product formed with a mold, a method of manufacturing the mold or the mold structure should be taken into account in the step of designing the 3-D model. In this case, according to a fourth aspect of the invention, the storage unit stores various pieces of mold structure information and mold manufacturing information as a working process database, and the computer unit determines an optimum mold structure and an optimum mold manufacturing condition using the working process database. Then, when the 3-D model must be corrected, a message indicating the necessity of correction is displayed at the display unit. According to the invention, when a drawing checker (engineer) for a 3-D model is not well acquainted with the techniques related to the mold design or mold structure, a 3-D model well adapted for these elements can be provided.

According to a fifth aspect of the invention, in the fourth aspect of the invention, material information for forming a product with a mold may be stored as a working process database, and the computer unit may determine an optimum mold structure, and an optimum mold manufacturing condition using the material information. In this way, a 3-D model well adapted for the material characteristic for forming the mold can be produced.

Meanwhile, in a 3-D modeling system according to a sixth aspect of the invention, the computer unit specifies a prescribed drawing checking item related to a basic shape for a 3-D model. Then, only elements for the specified drawing checking item are extracted and displayed at the display unit.

Briefly stated, in the case of a 3-D model, a number of elements may overlap or concentrate and size specification for fillet surfaces or chamfers is often omitted, and therefore errors at each part are hardly correctly recognized. Meanwhile, according to the sixth aspect of the present invention, only parts in a desired shape are displayed for each basic shape that can relatively easily be recognized, so that checking can be carried out without omission. As a result, it can readily and accurately be determined whether the shapes are formed as specified or intended in the design. Therefore, the drawing checking operation can be more efficient and the 3-D models can be designed less costly.

According to a seventh aspect of the invention, the extracted results corresponding to the drawing checking item may be classified into sub groups, and the classified results may distinctly be displayed. In this way, the drawing checking operation can more readily be carried out. The results can be distinctly displayed for example in different colors or by different types of hatching.

Alternatively, According to an eighth aspect of the invention, the extracted results corresponding to the drawing checking item may be classified for each specified size and the classified results may distinctly be displayed. In this way, parts the same in shape and yet different in size can easily be identified. Therefore, similarly to the seventh aspect of the invention, the drawing checking operation can more easily be carried out. For example, fillet surfaces extracted as a drawing checking item may be displayed in different colors for different R sizes.

In a 3-D modeling system according to a ninth aspect of the invention, the computer unit specifies a drawing checking item for which an individual worker is responsible for a 3-D model. Only an element for the specified drawing checking item is extracted and displayed at the display unit. In general, engineers are in charge of the drawing checking operation for a 3-D model. The checking operation for a 3-D model having more complicated elements is shared by engineers specializing in various fields. In this case, only a necessary drawing checking item for each engineer is displayed, so that the drawing checking can be more efficient and precise.

According to a tenth aspect of the invention, in the ninth aspect of the invention, the computer unit may extract an element for an drawing checking item based on a drawing information file including drawing information for each product. Here, the drawing information for each product includes the following information:

(a) Header field information including the item name, item number, surface treatment, heat treatment, material, weight, etc.

(b) Structure field information indicating sub parts of an assembly.

(c) Design change field information including the design change history.

(d) Annotation information including supplementary description about the product, necessary care to be taken in the manufacture, contents to be checked, etc.

(e) Size/tolerance information.

Their contents vary among products. In this way, the drawing checking items can appropriately be specified separately for the field of each drawing checker.

According to an eleventh aspect of the invention, the computer unit may extract a drawing checking item for which a drawing checker is responsible when the engineer is appointed and his/her name is input. In this way, the drawing checking items can easily be specified.

According to a twelfth aspect of the invention, design know-how related to a 3-D model is pre-registered as a design know-how database, and the computer unit carries out drawing checking using the design know-how database. In this way, the design know-how can be reflected upon the drawing checking operation, the computer unit is in charge of the drawing checking operation, and efficient drawing checking can be carried out.

According to a thirteenth aspect of the invention, there is a storage unit for storing a 3-D model database, and the 3-D model database is shared through a network. In this way, a plurality of drawing checkers can carry out drawing checking operation at the same time, so that the drawing checking can be even more efficient.

According to a fourteenth aspect of the invention, the storage unit stores a drawing checking item database including a large number of pieces of drawing checking item information, and the computer unit extracts an element for a specified drawing checking item from the drawing checking item database and has the extracted element displayed. In this way, the drawing checking items are pre-registered, and the computer unit can more easily extract elements.

According to a fifteenth aspect of the invention, each time drawing checking is completed for an extracted result corresponding to a drawing checking item, the checked part may be changed into a non-displayed state, while according to a sixteenth aspect of the invention, the number of parts to be subjected to drawing checking for the extracted result corresponding to the drawing checking item may be displayed. In this way, even a large number of parts can be checked without omission.

DETAILED DESCRIPTION OF THE PREFERRED EMBODIMENTS

First Embodiment

A first embodiment of the present invention will now be described in conjunction with the accompanying drawings. By the method described, a 3-D model is designed using a 3-D CAD system for a product to be resin-molded with a metal mold.

Figure 1:
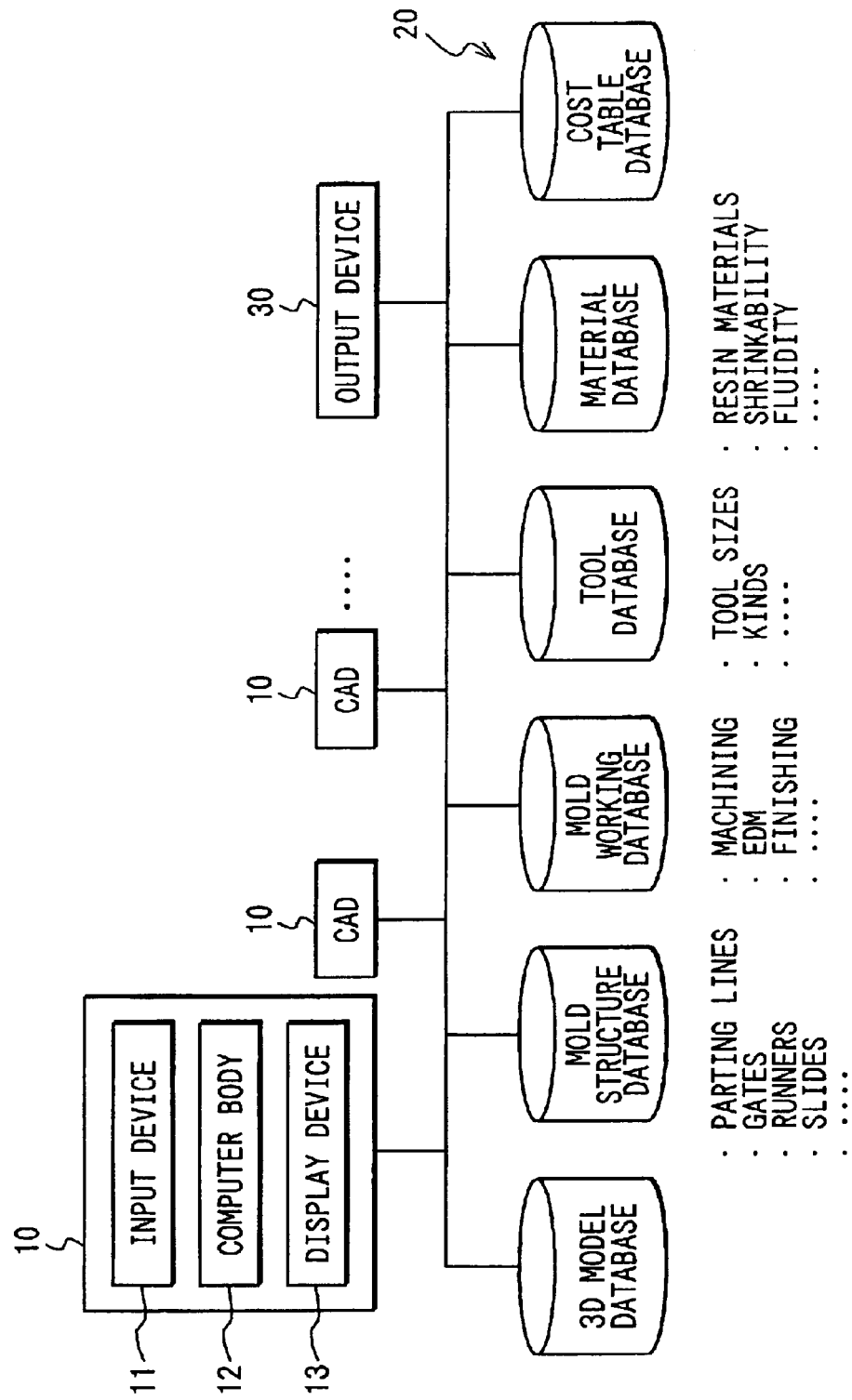
FIG. 1 is a block diagram of the configuration of a 3-D CAD system according to a first embodiment of the invention.

FIG. 1 shows the structure of the CAD system. In FIG. 1, a number of CAD units (computer terminals) 10 and a server 20 are connected with one another by a network such as LAN and can communicate with one another. The CAD units 10 have substantially the same configuration and each include an input device 11 including a keyboard, a mouse device and the like, a computer main body (computer unit) 12 forming the center of the system, and a display (display unit) 13. As well known, the computer main body 12 includes a logical operation circuit including a CPU, a memory and the like, and has various functions to automatically design a 3-D model. The display device 13 displays 3-D models designed by the computer main body 12 or various messages issued in the process of designing or drawing checking. An output device 30 such as a printer is also connected with the network.

The server 20 corresponds to a storage unit to store various databases. More specifically, the server 20 stores the following databases:

(1) A 3-D model database storing 3-D models designed by the CAD units 10;

(2) A mold structure database storing mold structure information related to parting lines, gates, runners, slides and the like;

(3) A mold working database storing working information related to machining, electric discharge machining, finishing, and the like;

(4) A tool database storing tool (edge tool) information such the size and kind of tools;

(5) A material database storing material information such as the kind, shrinkability, and fluidity of resin materials used to form a product with a mold; and (6) A cost table database storing cost information.

The databases (2) to (5) form working process databases, and the mold working information and the tool information databases (3) and (4) provide mold manufacturing information.

Figure 2:
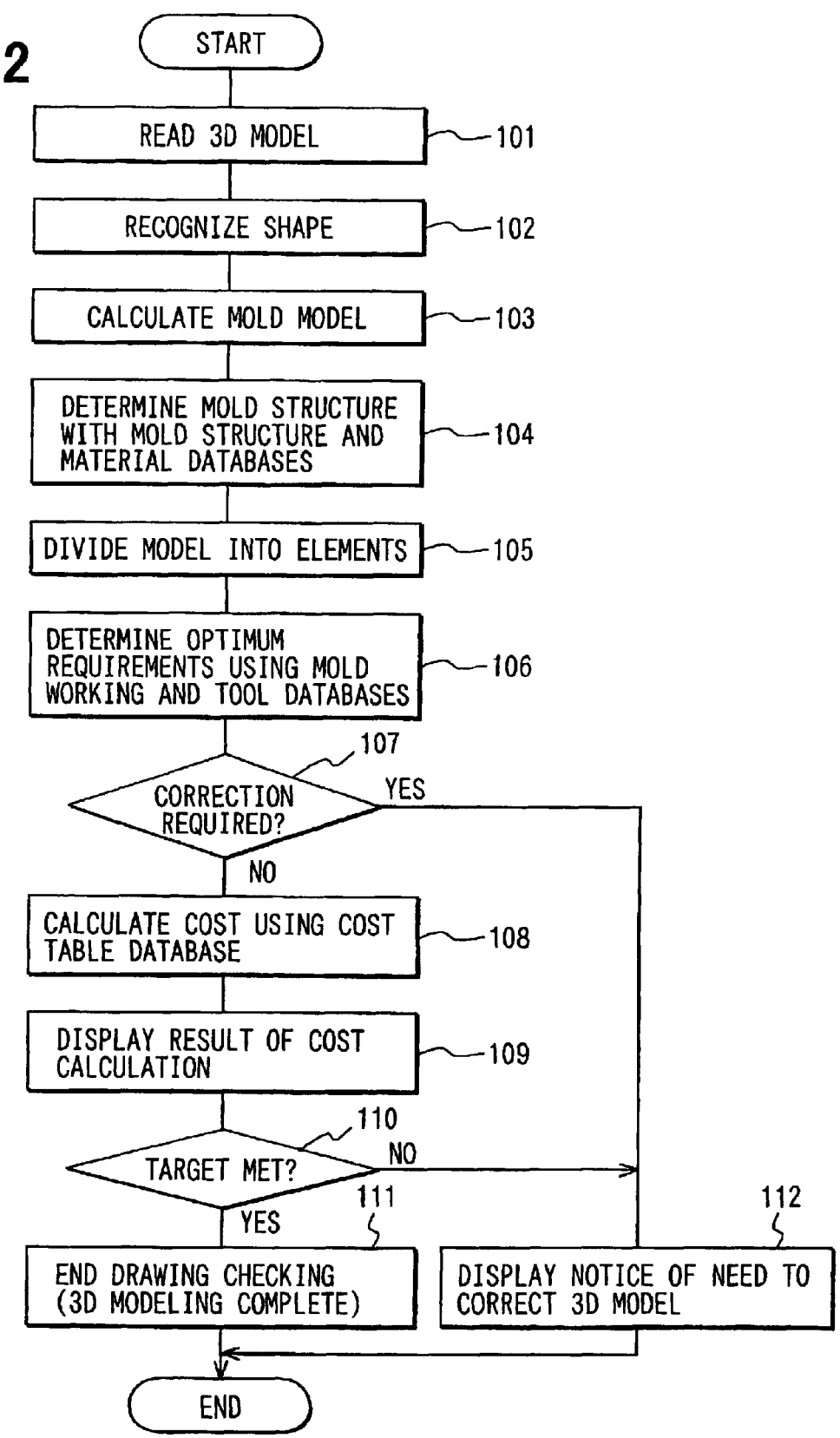
FIG. 2 is a flow chart illustrating a drawing checking routine using CAD units.

The process of drawing checking for a 3-D model will now be described in conjunction with FIG. 2. FIG. 2 illustrates the process of drawing checking carried out by the computer main body 12.

To start with, in step 101, a 3-D model for a product (design model) is read from the 3-D model database in the server 20. Then, in step 102, the shape of the read 3-D model is recognized. At the time, shapes such as fillets, chamfers, and ribs are recognized. Parts with small fillet surfaces (rounded corners), thin rib shapes, and surface texturing and the like are automatically recognized.

Then in step 103, a 3-D model for a resin molded product is subtracted from a mold block, and a mold model is produced. In the following step 104, the mold structure database and the material database in the server 20 are used to determine an optimum mold structure for the 3-D model at the moment. At the time, the kind, shrinkability, and fluidity of the resin material are taken into account while various requirements for the mold including the parting line, gate, runner, and slide are determined. In step 105, the thus produced mold model is divided into a plurality of elements, and in the following step 106, optimum working requirements are determined using the mold working database and the tool database in the server 20 for each of the elements divided from the model. The computer main body 12 determines requirements (mold and working requirements) for producing the mold as described above, and has each of them displayed on the display device 13. Therefore, with or without knowledge of mold manufacture, the drawing checker can find requirements necessary for the process of producing the mold.

Note that the 3-D model and the mold model have the same shape and therefore the 3-D model rather than the mold model may be divided into elements and used for determining the working requirements in the step 105 and step 106.

Subsequently, it is determined in step 107 whether or not to correct the 3-D model based on the consistency with the working requirements determined as described above. In this case, the drawing checker determines whether or not the present 3-D model is consistent with the above working requirements without any discrepancy (Whether the model is practicable), and if it is consistent (practicable), the message "correction not necessary" is generated. If model is not consistent with the requirements (impracticable), the message "correction necessary" is generated. The computer main body 12 determines whether or not to correct the model in the step 107 based on the result input by the drawing checker. If for example the use of a particular tool is a determined working requirement, and it is determined that the 3-D model cannot be produced based on the size and shape of the tool, the result of determination in the step 107 is affirmative.

When the 3-D model must be corrected, the control proceeds to step 112, and a correction to the 3-D model is ordered. More specifically, the computer main body 12 has the message "correction necessary to the model" displayed on the display device 13. Thus, a correction to the 3-D model is recommended, and the 3-D model is corrected (reconsidered) as required in response to the message "correction necessary."

When no correction is necessary to the 3-D model, the control proceeds to step 108. In the step 108, the cost for manufacturing a product is calculated using the cost table database in the server 20, and it is then determined in the following step 109 whether or not the calculated cost satisfies a target cost requirement. If the target cost requirement is not met, the control proceeds to the step 112 and a correction to the 3-D model is ordered.

When the target cost requirement is met, the control proceeds to step 111, and it is determined that the drawing checking for the 3-D model is over and that the 3-D model has been completed. The 3-D model after the drawing checking is stored in the 3-D model database in the server 20 together with data indicating the end of the drawing checking.

According to the embodiment as described above, the following effects are brought about.

While the working process information such as mold requirements or working requirements is added to the 3-D model, the drawing can appropriately be checked. Therefore, if the drawing checker checking the 3-D model is not well acquainted with the working process (succeeding process) for the product, the 3-D model well adapted for the working process can be provided. Therefore, the drawing checking operation is more efficient, and the 3-D models can be designed less expensively. In addition, different drawing checkers could be in charge and still resulting models do not vary; in other words, the design quality of the 3-D models is also improved.

Particularly, for products to be formed with a mold, a 3-D model well adapted for techniques related to the designing or manufacture of molds can be provided. In this case, a 3-D model well-adapted for manufacturing molds can be produced even when only a short period of time can be taken for designing.

Since the cost is taken into account in drawing checking for a 3-D model and a correction is ordered, if necessary, a 3-D model satisfying a cost requirement (target cost requirement) can be produced.

It is understood that this approach is applicable to other models than the 3-D models to be formed with a mold such as a 3-D model whose working process (succeeding process) includes a cutting, finishing, surface treatment, and the like. In this case, working process information related to the cutting, finishing and surface treatment is added to a 3-D model, and the drawing can appropriately be checked. Therefore, the drawing checking operation is more efficient and the cost is reduced.

Second Embodiment

A second embodiment of the present invention will now be described particularly in connection with the differences between the first embodiment and the second embodiment. According to the second embodiment, some drawing checking items related to the basic shapes are specified in drawing checking for a 3-D model, and the drawing is sequentially checked for the drawing checking items. Here, the drawing checking items are specified by a drawing checker for every checking occasion, and may include fillet surfaces (rounded corners), chamfers, symmetry, interference, contacting parts, draft, etc. Briefly stated, drawing checking items are specified for each basic shape that can relatively easily be recognized.

Figure 3:
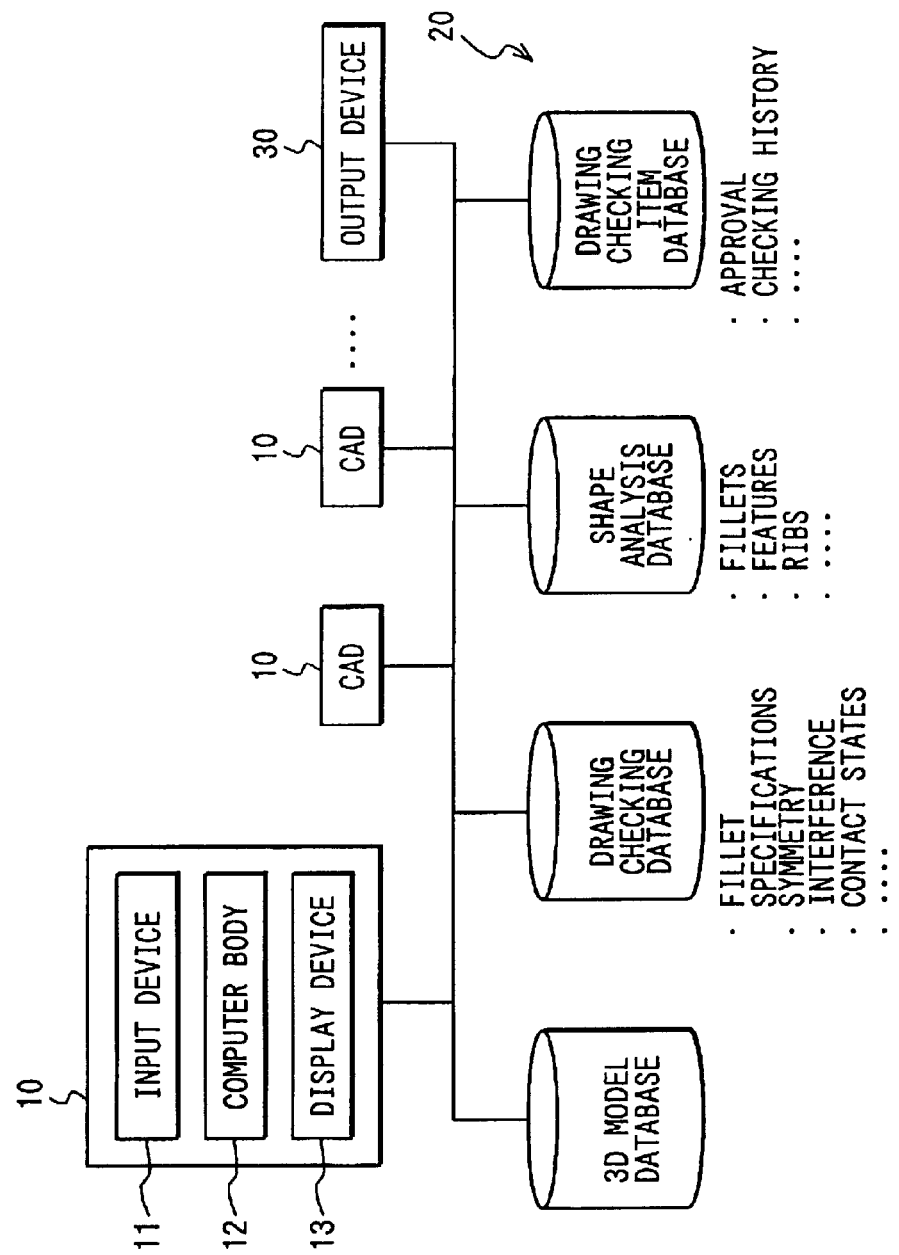
FIG. 3 is a block diagram of the configuration of a 3-D CAD system according to a second embodiment of the invention.

FIG. 3 is a block diagram of the configuration of a CAD system according to the embodiment. The server 20 has a different structure from that in FIG. 1 and stores the following databases:

(1) A 3-D model database storing 3-D models designed using CAD units 10.

(2) A drawing checking item database storing drawing checking item information such as specification of fillet surfaces, symmetry, interference and contacting states.

(3) A shape analysis database storing shape analysis information on the shapes of fillets, features, ribs, and the like.

(4) A drawing checking database storing drawing checking result information such as approval and a drawing checking history.

Figure 4:
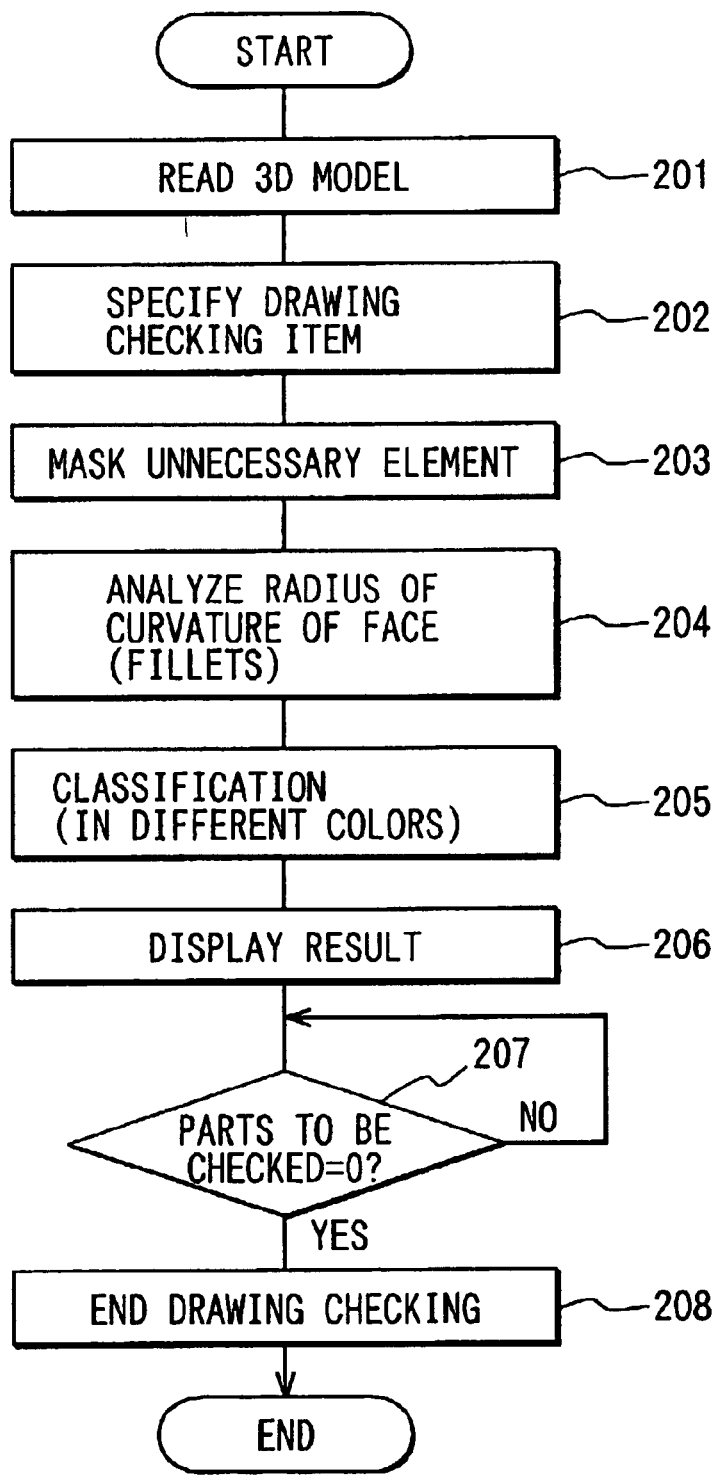
FIG. 4 is a flowchart illustrating a drawing checking routine using CAD units.

FIG. 4 is a flow chart for use in illustration of the process of drawing checking carried out by the computer main body 12. Here, a case of specifying a fillet surface as a drawing checking item will be described by way of illustration.

To start with, in step 201, a 3-D model for a product is read from the 3-D model database, and then in step 202, a drawing checking item (the fillet surface in this case) is specified in response to an instruction from the drawing checker. Then in step 203, unnecessary elements irrelevant to the specified drawing checking item (the fillet surface) are masked and only necessary elements are extracted.

Then in step 204, the elements extracted in the step 203 are subjected to shape analysis using the shape analysis database. At the time, the radius of curvature of each extracted part is analyzed, and parts with a relatively large radius of curvature are excluded from the objects to be checked. More specifically, the extracted elements in the step 203 could include a part with a relatively large radius of curvature (curved surface) other than the fillet surface. The fillet surface and the curved surface are provided for different purposes or have different requirements in design, and therefore, the curved surfaces are excluded from the object to be checked.

Then in step 205, the fillet surfaces are colored differently for different specified sizes, and the result is given on the display device 13. The colors for the fillet surfaces may be specified by the drawing checker. In this state, the drawing checking is carried out by the drawing checker. At the time, every time the drawing checking is completed for a part, the computer main body 12 changes the checked part into a non-displayed state (made invisible). More specifically, the color of the part is removed. The computer main body 12 counts the number of checked parts, and the number of parts yet to be checked is displayed on the display device 13. Every time drawing checking to a part is finished, the number of parts yet to be checked is decremented by one.

It is determined in step 207 whether or not the number of parts yet to be checked is zero. If the number of parts yet to be checked is zero, the control proceeds to step 208. It is determined in the step 208 that the drawing checking is completed. At that time, drawing checking information such as the approval and drawing checking history is stored in the drawing checking result database in the server 20.

Figure 5A:
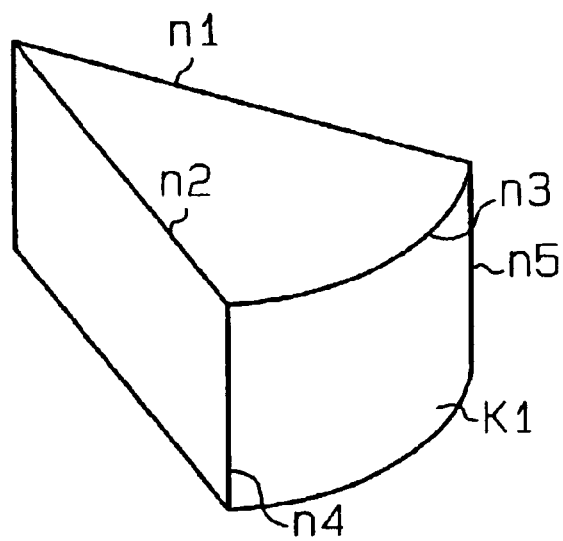
FIGS. 5A to 5C are perspective views for use in detailed illustration of the drawing checking process.
Figure 5B:
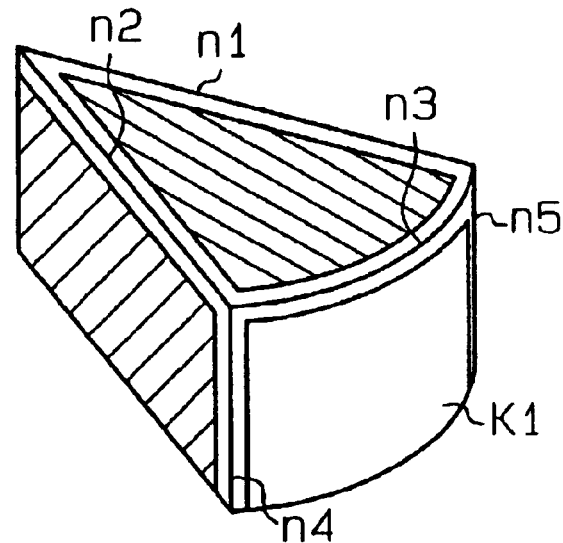
Figure 5C:
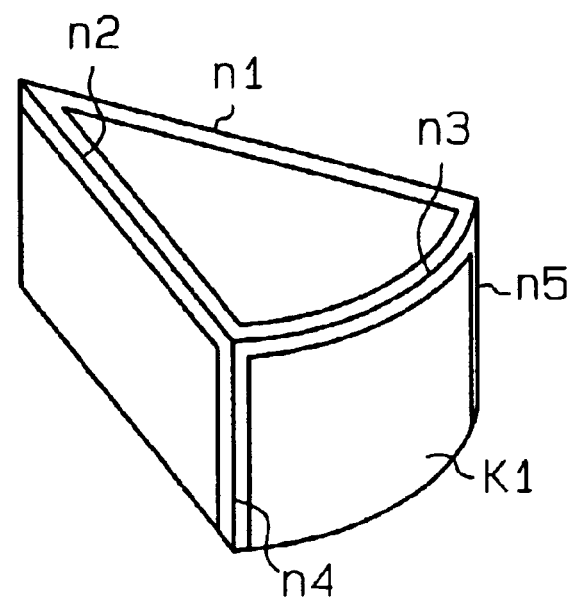

The process of drawing checking will more specifically be described in conjunction with FIGS. 5A to 5C. Note that in the 3-D model of FIGS. 5A to 5C, as an example, a prescribed fillet surface is provided at each of sides n1 to n5 (note however that the fillet surfaces are not shown for the ease of representation). K1 represents a curved surface having a relatively large radius of curvature.

In FIG. 5A, a 3-D model as shown is read. In FIG. 5B, a fillet surface is specified as a drawing checking item, so that unnecessary elements are masked. Thus, the sides n1 to n5 and the curved surface K1 in the figures are extracted. The masked elements (unnecessary elements) are hatched.

In FIG. 5C, among the extracted fillet surfaces, the curved surface K1 that is not a fillet surface is excluded, and the remaining parts are identified by different colors for corresponding specified sizes for fillet surfaces. More specifically, when n1, n2=R0.5, n3=R1.0, and n4, n5=R0.3 according to the size specification, the parts n1 and n2 are colored in red, the part n3 in blue, and the parts n4 and n5 in green. Note that these rules are functionally customized by the user as desired.

The drawing checker checks the drawing for each colored part. In this case, every time drawing checking is finished for a part, the checked part is changed into a non-displayed state. More specifically, after the checking, the color is removed. Also at the time, the number of parts yet to be checked displayed at the display device 13 is decremented by one.

According to the second embodiment, only a part in a desired shape is displayed for each basic shape that is relatively easily recognized, so that the drawing checker can be prevented from omitting parts yet to be checked. As a result, it can readily and accurately be determined whether or not the shape is made into the instructed or intended design. Therefore, the drawing checking operation can be more efficient and 3-D models can be designed less expensively.

Extraction results corresponding to drawing checking items (such as a fillet surface) are indicated in different colors for different specified sizes, and therefore parts the same in shape and yet different in size can easily be identified. Therefore, the drawing checking operation can more easily be carried out. In this case, the fillet surfaces may be displayed in different colors or with different types of hatching for different specified sizes.

At the end of drawing checking for each part, the part is changed into a non-displayed state and the number of parts yet to be checked is displayed, so that even a large number of parts can be checked without omission.

Third Embodiment

According to a third embodiment, the drawing items to be checked by each engineer for a 3-D model (the range of drawing checking the engineer is responsible for) are specified, and only elements for the specified drawing checking items are extracted.

More specifically, at present, the task of drawing checking for a 3-D model is shared between a plurality of engineers. The drawing checking operation for a 3-D model having more complicated elements is shared by a larger number of engineers specializing in various fields. In this case, which drawing checker is to be in charge of which element needs only be determined referring to drawing information files including drawing information for each product, and the items to be referred to are for example as follows:

(a) Header field information including the item name, the item number, surface treatment, heat treatment, the kind of material, weight, etc.

(b) Structure field information indicating sub parts of an assembly.

(c) Design change field information including a design change history.

(d) Annotation information including supplementary description about the product, necessary care to be taken in the manufacture, contents to be checked, etc.

(e) Size/tolerance information.

Alternatively, the above (a) to (e) may further be divided and the drawing checking operation may be shared. Such sharing of the operation is similarly carried out in the operation using two-dimensional drawings, while in a 3-D model, detailed shapes or how to produce the model, the presence/absence of necessary parameters and the like are added and the number of items should increase accordingly.

Figure 6:
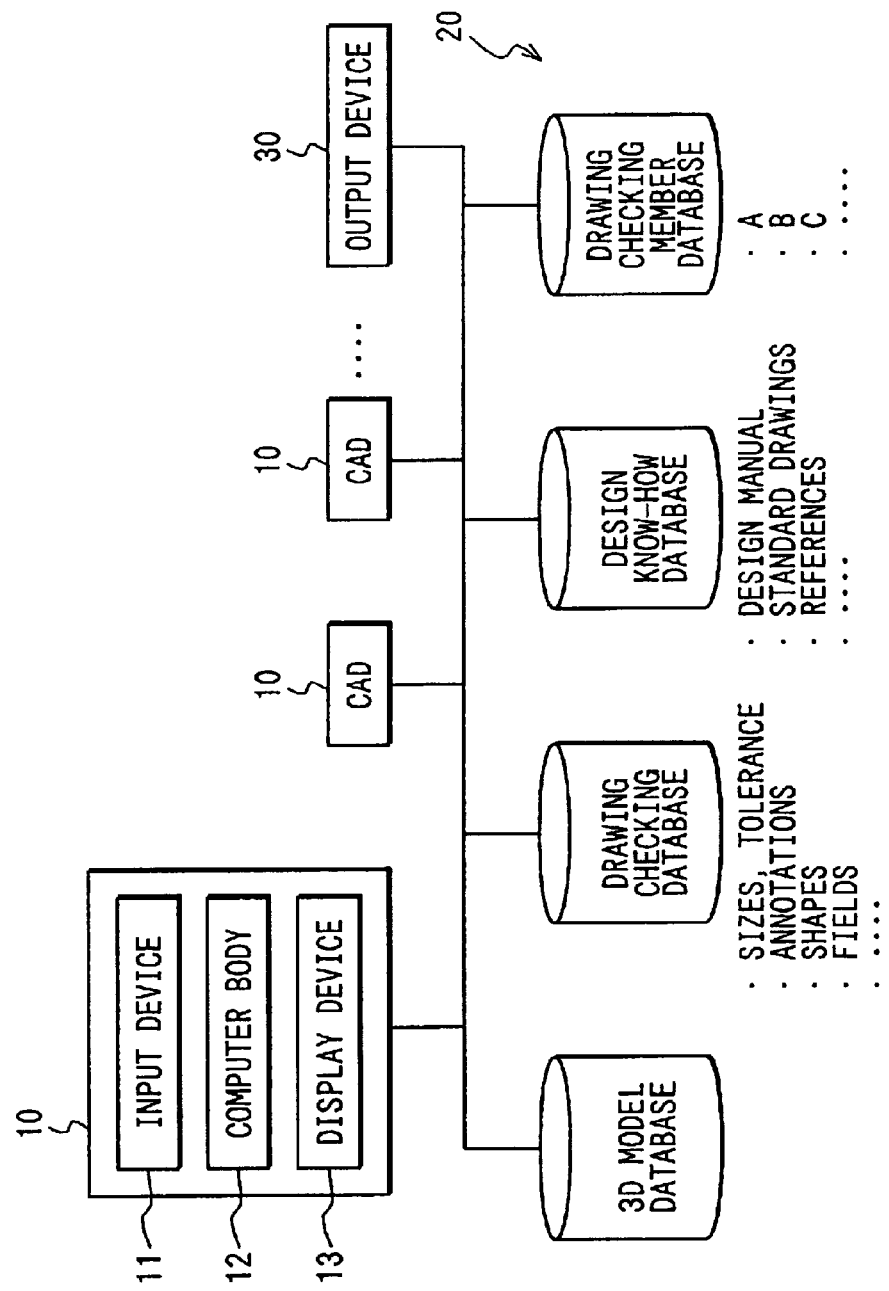
FIG. 6 is a block diagram of the configuration of a 3-D CAD system according to a third embodiment of the invention.

FIG. 6 is a block diagram of the configuration a CAD system according to the embodiment. The server 20 has a different structure from those in FIGS. 1 and 3. The server 20 stores the following databases:

(1) A 3-D model database storing 3-D models designed using CAD units 10.

(2) A drawing checking item database storing drawing checking item information for each drawing checker to be in charge of such as sizes/tolerance, annotation, shapes, and fields.

(3) A design know-how database storing design know-how information such as design manuals, standard drawings, and references.

(4) A drawing checker database storing drawing checker information.

Note that the 3-D model database in the above (1) stores 3-D models for products and drawing information for individual products (information in the above (a) to (e)) in the form of drawing information files. The drawing checking item database in the above (2) stores drawing checking item information so that the drawing information for individual products (the above (a) to (e)) is all covered.

Figure 7:
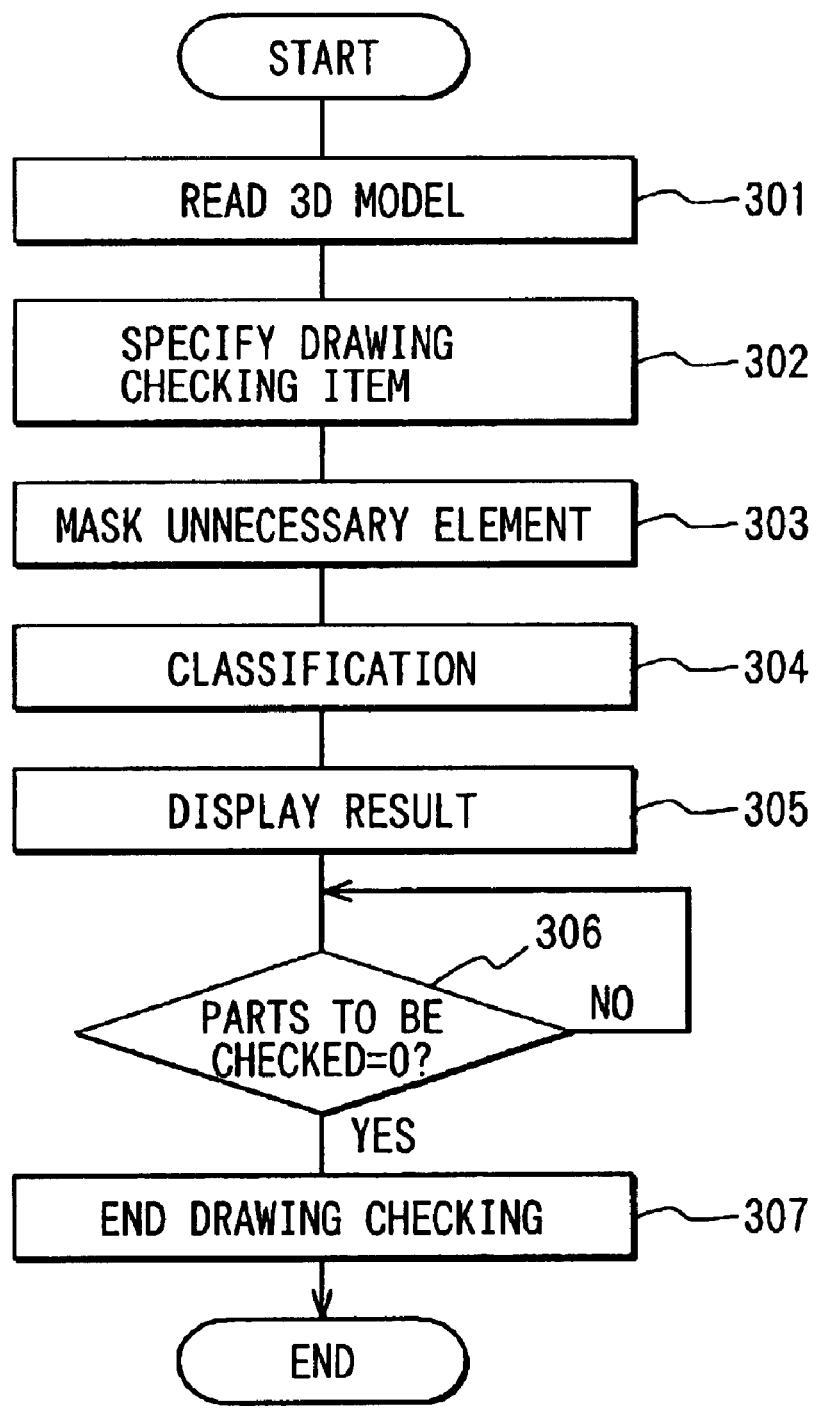
FIG. 7 is a flow chart illustrating a drawing checking process using CAD units.

FIG. 7 is a flowchart for use in illustration of the process of drawing checking carried out by the computer main body 12.

To start with, in step 301, a 3-D model for a product is read from the 3-D model database, and then in step 302, a drawing checking item for each drawing checker to be in charge of is specified based on the drawing checking item database. Then in step 303, unnecessary elements irrelevant to the specified drawing checking item are masked and only the necessary elements are extracted.

Then in step 304, the elements extracted in the step 303 are further divided into detailed groups. At the time, extracted results are further classified based on items described in the header field, the structure field, or the like. Note, however, that the classification process can be omitted. Then in step 305, the results of extraction corresponding to the items to be checked are displayed on the display device 13. In this state, the engineer checks the drawing. At the time, each time a part is checked, the computer main body 12 changes the checked part into a non-displayed state. When the part is colored, the color is removed. The computer main body 12 counts the number of parts already checked, and displays the number of parts yet to be checked on the display device 13. Each time drawing checking for a part is finished, and the number of parts yet to be checked is decremented by one.

It is determined in step 306 whether or not the number of parts yet to be checked is zero. If the number=0, the control proceeds to step 307. In the step 307, the end of the drawing checking is determined.

Meanwhile, the computer main body 12 may be in charge of drawing checking operation using the design know-how database. The design know-how needs only be adapted to the design rules or other rules determined by each designing department. In this case, the computer main body 12 automatically carries out drawing checking. When, for example, the material, structure, and surface treatment are determined by the item number, the drawing checking operation is automatically carried out based on annotation field (header field, structure field, etc) information corresponding the item number of the object read from the pre-registered databases.

According to a third embodiment, only a drawing checking item necessary for each drawing checker in charge (the range of drawing checking the engineer is responsible for) is displayed, and therefore the drawing checking operation can efficiently and highly precisely be carried out. The time or people for drawing checking can be reduced in the future to cope with the demand for reducing the period for designing and developing or the cost, but still the precision of the drawing checking can be improved and high quality 3-D models can be provided under the circumstances.

The computer main body 12 carries out the drawing checking using the design know-how database, so that the design know-how can be reflected on the drawing checking operation, and more efficient drawing checking can be performed.

In the structure shown in FIG. 6, a large number of CAD units 10 are connected through a network, and the 3-D model database can be shared through the network. Therefore, a plurality of drawing checkers can carry out drawing checking operation at the same time, so that the drawing checking can be even more efficient.

The present invention is applicable in the following embodiment in addition to the above.

According to the first embodiment, after the working requirement is determined, the actual drawing checking operation is carried out by a drawing checker. However, this operation can be carried out by the computer main body 12. For example, the process of drawing checking including design rules and know-how (the drawing checking process database) may be registered in the server 20, and the computer main body 12 may be allowed to automatically carry out drawing checking according to the drawing checking process.

According to the second embodiment, results of extraction corresponding to the drawing checking items are divided based on specified sizes. However, the results may be divided based on other conditions (other than specified sizes).

According to the third embodiment, a drawing checker in charge is appointed and the name is input, in response to which the computer main body 12 may extract a drawing checking item for the engineer to be in charge and the extracted item may be displayed. The name of the engineer may directly be input or the identification data of the engineer (ID number) may be input.

A check list is produced for each drawing checking item and registered in the server 20 as a check list database so that the same result is obtained by any engineer without special knowledge. The drawing checker may carry out drawing checking based on the check list database. The check list database is preferably updated as required.

The approach of displaying prescribed specified items on the display device can be applied not only in the drawing checking but also in producing a design model. In this case, "design items" rather than "drawing checking items" are specified. In this way, a 3-D model can readily and highly precisely be produced because only a part in a desired shaped is displayed.

According to the above embodiments, although a 3-D modeling system is constructed using the units generally referred to as "CAD" or software, a 3-D modeling system may be constructed using a unit referred to as "CAM" or "CAE."

What is claimed is:

1. A 3-D modeling method performed with a computer, the method comprising:

displaying a 3-D model of a product with display unit;

recognizing the shape of the 3-D model and dividing the model into a plurality of elements based on shape recognition;

determining optimum working requirements for each of the elements from working process information stored in a database;

determining whether a correction is necessary to the model based on the working requirements;

if a correction is necessary, displaying a message indicating that correction is necessary;

storing cost information in a storage unit;

calculating a cost corresponding to the determined working requirement; and displaying the cost.

2. The method according to claim 1 wherein when a 3-D model does not satisfy a predetermined target cost requirement, displaying a message indicating a necessity to correct the model.

3. A 3-D modeling method performed with a computer, the method comprising:

displaying a 3-D model of a product with display unit;

recognizing the shape of the 3-D model and dividing the model into a plurality of elements based on shape recognition;

determining optimum working requirements for each of the elements from working process information stored in a database;

determining whether a correction is necessary to the model based on the working requirements;

if a correction is necessary, displaying a message indicating that correction is necessary;

storing various pieces of mold structure information and mold manufacturing information in the database; and determining an optimum mold structure and an optimum mold manufacturing condition using the database.

4. The method according to claim 3 further comprising:

storing information concerning materials for forming a product with a mold in the database; and determining the optimum mold structure and the optimum mold manufacturing condition using the information concerning materials.

5. A 3-D modeling method performed with a computer as in claim 3, the method further comprising:

displaying a 3-D model of a product with a display unit, wherein the display unit is connected to a computer;

specifying a prescribed drawing checking item related to a basic shape of the 3-D model; and extracting only an element for the specified drawing checking item and displaying the extracted element with the display unit.

* * * * *